(12) United States Patent
Chow et al.

(10) Patent No.: US 7,292,050 B1
(45) Date of Patent: Nov. 6, 2007

(54) MEASURING ROTATIONAL MISALIGNMENT USING SPATIAL INTERFERENCE PATTERNS

(75) Inventors: Alex Chow, Palo Alto, CA (US); Ronald Ho, Mountain View, CA (US); Robert D. Hopkins, Hayward, CA (US)

(73) Assignee: Sun Microsystems, Inc, Santa Clara, CA (US)

( * ) Notice: Subject to any disclaimer, the term of this patent is extended or adjusted under 35 U.S.C. 154(b) by 0 days.

(21) Appl. No.: 11/509,245

(22) Filed: Aug. 23, 2006

(51) Int. Cl.
*G01R 27/26* (2006.01)
(52) U.S. Cl. .................. 324/681; 324/686; 702/179
(58) Field of Classification Search ............... 324/681, 324/686; 702/179
See application file for complete search history.

(56) References Cited

U.S. PATENT DOCUMENTS 4,982,333 A * 1/1991 Ackerman et al. ............ 700/95

2003/0158701 A1 * 8/2003 Yasuda et al. ............... 702/179
2005/0253066 A1 * 11/2005 Watanabe et al. ........... 250/310

* cited by examiner

*Primary Examiner*—Vincent Q. Nguyen
(74) *Attorney, Agent, or Firm*—Park, Vaughan & Fleming LLP; Steven E. Stupp

(57) ABSTRACT

A method for determining misalignment between two semiconductor dies is described in which signals are transmitted through a first subset of an array of proximity connectors that are proximate to a surface of one of the semiconductor dies and received through a second subset of an array of proximity connectors that are proximate to a surface of the other semiconductor die. A spatial beat frequency is determined from the received signals. This spatial beat frequency corresponds to misalignment-induced aliasing of spatial frequencies associated with the first subset of the array of proximity connectors and the second subset of the array of proximity connectors. The misalignment is then determined using the spatial beat frequency.

20 Claims, 14 Drawing Sheets

MEASURING ROTATIONAL MISALIGNMENT USING SPATIAL INTERFERENCE PATTERNS

BACKGROUND

1. Field of the Invention

The present invention relates to techniques for communicating signals between semiconductor dies. More specifically, the present invention relates to a method and an apparatus for determining misalignment between semiconductor dies based on spatial interference patterns.

2. Related Art

Advances in semiconductor technology presently make it possible to integrate large-scale systems, which can include tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem has created a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, the first chip can directly transmit signals to the second chip without having to route the signals through intervening signal lines within a printed circuit board.

Capacitive coupling requires proper alignment between the transmitter pads and the receiver pads, both in a plane defined by the pads and in a direction perpendicular to the plane. Misalignment between the transmitter pads and the receiver pads may cause each receiving pad to span two transmitting pads, thereby destroying a received signal. In theory, satisfactory communication requires alignment such that misalignment is less than half of a pitch between the pads. In practice, the alignment requirements may be more stringent. In addition, limiting overall misalignment may improve communication performance between the chips and reduce power consumption.

Unfortunately, it can be very challenging to align the chips properly. Existing approaches include mechanical mounting structures that incorporate self-alignment and/or self-adjustment of pad positions. However, due to thermal expansion and mechanical vibrations, as well as manufacturing and assembly perturbations, even with very careful mechanical assembly the chips often still have some residual misalignment. Other techniques such as electronic steering, in which data signals are routed to particular pads in an array of pads, may be used to further reduce the effects of misalignment. Implicit to many of these solutions, however, is the ability to measure the alignment of the chips.

One existing alignment measurement technique assigns a charge to conducting pads on one chip, and detects a pattern of charges that are induced in the pads on a facing chip. Another existing system improves upon this technique by providing an array of conductive pads on the first chip and an array of conductive pads on the second chip with a different spacing than the conductive pads on the first chip. When the conductive pads on the first chip overlap with the conductive pads on the second chip, a vernier is created, allowing the alignment between the chips to be determined.

These existing approaches, however, have limitations. Measurements using such techniques are often complex and slow. The results may also be inaccurate, especially for small misalignment values, since these approaches rely on being able to detect very small differences in capacitances for each pad. Unfortunately, due to noise and other instrument limitations, accurately detecting such small differences in capacitances is often not possible.

Hence, what is needed is a method and an apparatus to determine misalignment and facilitate capacitive inter-chip communications without the problems listed above.

SUMMARY

One embodiment of the present invention provides a method for determining misalignment between two semiconductor dies. Signals are transmitted through a first subset of an array of proximity connectors that are proximate to a surface of one of the semiconductor dies. The signals are then received through a second subset of an array of proximity connectors that are proximate to a surface of the other semiconductor die. A spatial beat frequency is determined from the received signals. This spatial beat frequency corresponds to misalignment-induced aliasing of spatial frequencies associated with the first subset of the array of proximity connectors and the second subset of the array of proximity connectors. The misalignment is then determined using the spatial beat frequency.

In some embodiments the two semiconductor dies are configured to communicate via capacitive coupling, and/or to communicate optically, inductively or conductively.

In some embodiments, the signals are received by measuring a set of capacitance values and/or by measuring a set of voltages corresponding to the signals on the second subset of proximity connectors.

In some embodiments, the misalignment corresponds to an angular rotation of the two semiconductor dies with respect to one another in a plane substantially parallel to the surface of one of the two semiconductor dies and/or to translational misalignment of the first semiconductor die relative to the second semiconductor die.

In some embodiments, the first subset of the array of proximity connectors and/or the second subset of the array of proximity connectors are arranged substantially along a set of parallel lines. Furthermore, in some embodiments, a pitch between adjacent proximity connectors in the first subset is different that a pitch between adjacent proximity connectors in the second subset.

In some embodiments, locations of extrema of the received signals are determined and a sign of the misalignment is calculated based on these locations.

Electrical signals may be steered using a steering mechanism to enable communication between the two semiconductor dies via capacitive coupling. The steering mechanism may be internal to a given array of proximity connectors that are proximate to the surface of one of the semiconductor dies based on the misalignment. Furthermore, the misalignment may be determined once, continuously or at times separated by an interval. In some embodiments, the interval is fixed or variable.

In another embodiment, a configuration to determine misalignment between a first semiconductor die and a second semiconductor die includes the proximity connectors arranged in the first array and the proximity connectors arranged in the second array. The first semiconductor die and the second semiconductor die may be configured to perform the operations in the method as described above.

Another embodiment of the present invention provides a computer system that includes a device containing the first semiconductor die and the second semiconductor die. The first semiconductor die and the second semiconductor die may be configured to perform at least corresponding subsets of the operations in the method as described above.

BRIEF DESCRIPTION OF THE FIGURES

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method, a device, and systems that include the device are described. In the method, misalignment between two semiconductor dies that communicate using proximity connectors is accurately determined based on a spatial beat frequency associated with the misalignment. This spatial beat frequency is determined by transmitting signals using proximity connectors proximate to a surface of one of the semiconductor dies and receiving signals using proximity connectors proximate to a surface of the other semiconductor die. Aliasing or interference patterns of spatial frequencies associated with the two sets of proximity connectors gives rise to the spatial beat frequency, which may be determined from the received signals.

In some embodiments, the misalignment corresponds to an angular rotation of the two semiconductor dies with respect to one another in a plane substantially parallel to the surface of one of the two semiconductor dies. A sign of this misalignment may be determined based locations of extrema (a so-called peak front) in the received signals.

The semiconductor dies may be configured to communicate via capacitive coupling and/or to communicate optically. The signals may be received by measuring a set of capacitance values and/or by measuring a set of voltages corresponding to the signals on the proximity connectors in one of the semiconductor dies. Furthermore, in some embodiments a pitch between adjacent proximity connectors in the two semiconductor dies is the same or is different.

Electrical signals in either of the semiconductor dies may be steered to given proximity connectors based on the determined misalignment thereby facilitating proximity communication between the semiconductor dies. To facilitate this steering, the misalignment may be determined continuously or at times separated by intervals (such as fixed time intervals). However, in some embodiments, the misalignment is determined intermittently, such as during a calibration mode of operation.

Figure 1:
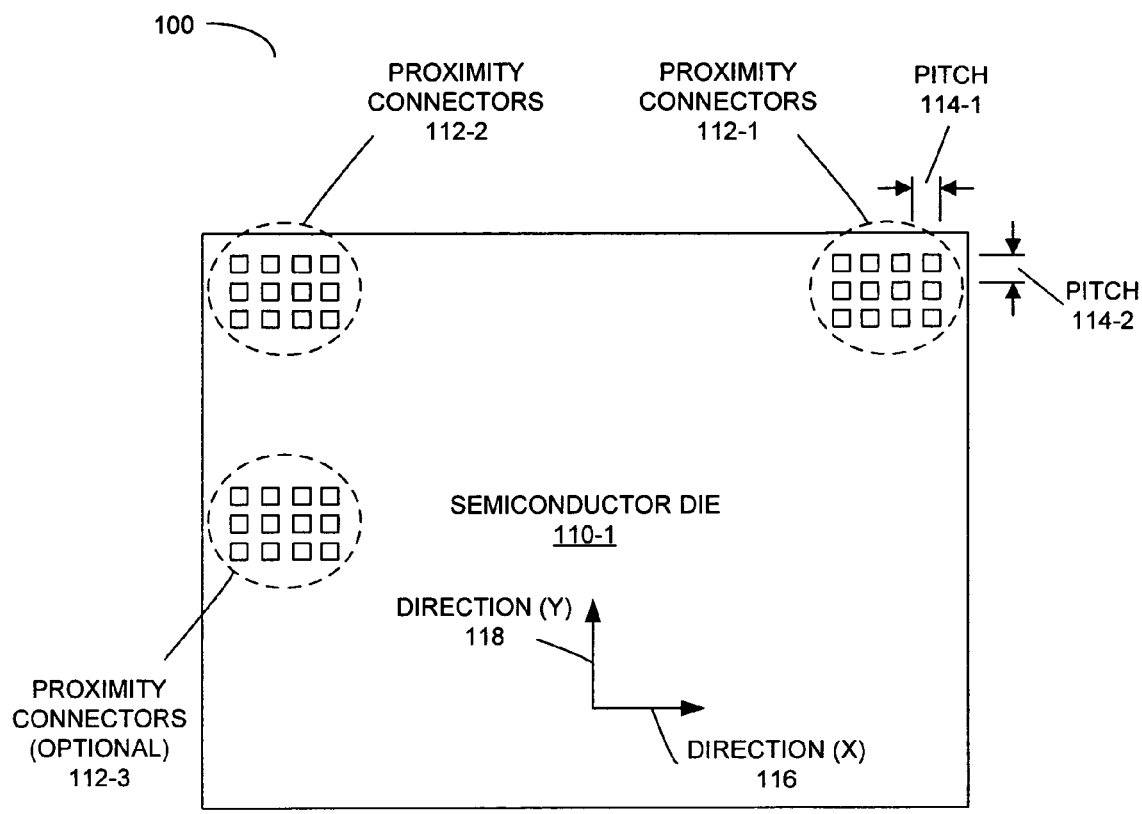
FIG. 1 is a block diagram illustrating a device that includes proximity connectors in accordance with an embodiment of the present invention.

We now describe embodiments of devices and systems that include proximity communication. FIG. 1 presents a block diagram illustrating a device 100 that includes proximity connectors or pads 112 in accordance with an embodiment of the present invention. Device 100 may include at least one semiconductor die 110, wherein semiconductor die 110 may include integrated circuit electronics corresponding to layers deposited on a semiconductor substrate. Note that semiconductor die 110 may be packaged in a single-chip module (SCM) and/or a multi-chip module (MCM), wherein the MCM may include two or more SCMs. When packaged, for example in the SCM or the MCM, the one semiconductor die 110 is sometimes referred to as a "chip."

In one embodiment, the proximity connectors 112 may be on or proximate to at least one surface of the semiconductor die 110, the SCM and/or the MCM. In other embodiments, the semiconductor die 110, the SCM and/or the MCM may be coupled to the proximity connectors 112. In an exemplary embodiment, arrays of proximity connectors 112 are substantially located at or near one or more corners (proximity connectors 112-1 and 112-2) and/or edges (proximity connectors 112-3) of the semiconductor die 110. In other embodiments, proximity connectors 112 may be situated at one or more arbitrary locations on, or proximate to, the surface of the semiconductor die 110.

As illustrated for the proximity connectors 112-1, there is a first pitch 114-1 between adjacent connectors or pads in a first direction (X) 116 of the surface and a second pitch 114-2 between adjacent connectors or pads in a second direction (Y) 118 of the surface. In some embodiments, the first pitch 114-1 and the second pitch 114-2 are approximately equal.

Figure 2:
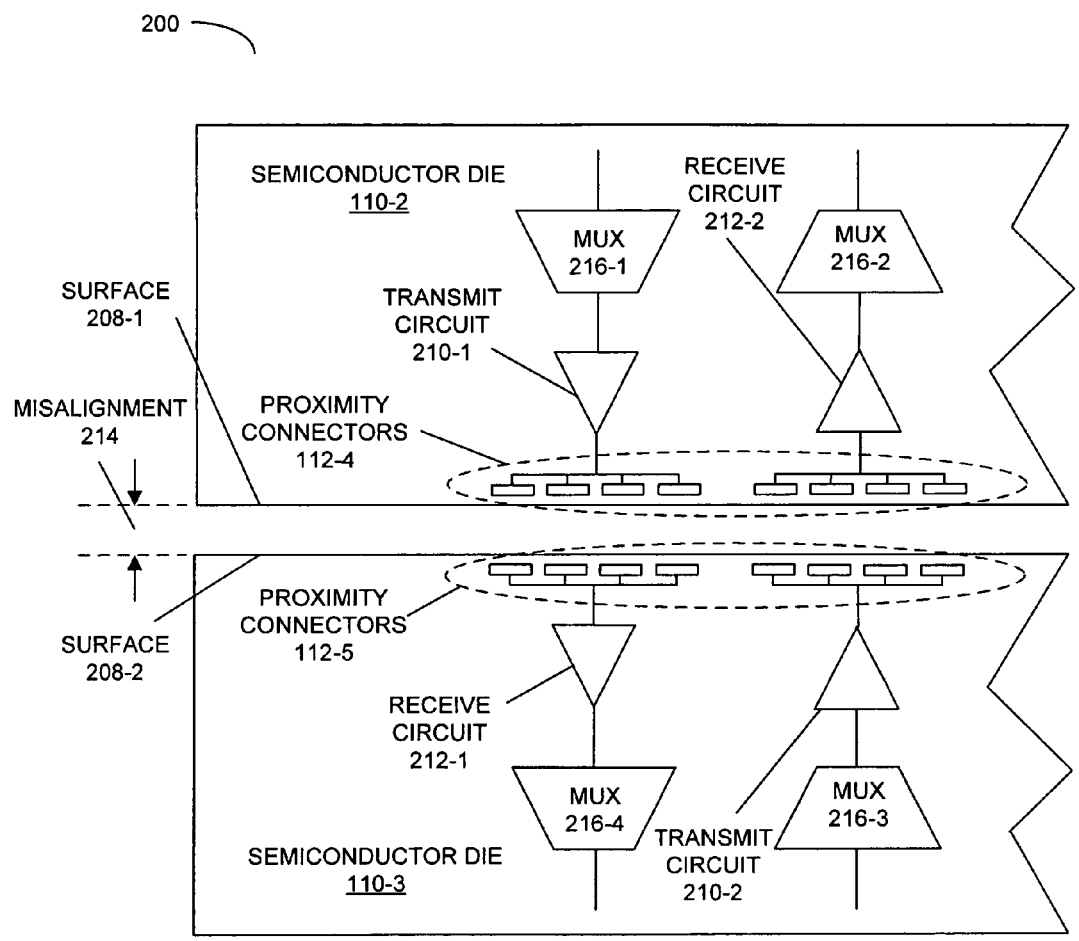
FIG. 2 is a block diagram illustrating a system that includes semiconductor dies that communicate using proximity communication in accordance with an embodiment of the present invention.

FIG. 2 presents a block diagram illustrating a system 200 that includes semiconductor dies 110 that communicate using proximity communication in accordance with an embodiment of the present invention. The devices 110 may include proximity connectors 112 that are on or proximate to at least respective surfaces 208 of the semiconductor dies 110. For example, the plurality of proximity connectors 112 may be situated beneath protective layers such that they are located below the surfaces 208. Moreover, subsets of the proximity connectors 112 may be coupled to transmit circuits 210 (such as transmit drivers) and receive circuits 212 (such as receivers). One of the transmit circuits 210, at least a subset of the proximity connectors 112 on the adjacent semiconductor dies 110, and one of the receive circuits 212 may constitute a communication channel. For example, the communication channel may include transmit circuit 210-1, some of the proximity connectors 112, and receive circuit 212-1. Note that transmit circuits 210 and receive circuits 212 may utilize current-mode signaling (i.e., current-mode drivers and receivers) and/or voltage-mode signaling (i.e., voltage-mode drivers and receivers). Furthermore, semiconductor dies 110 may also include wiring and electronics (not shown) to relay the data signals to additional electronics on the semiconductor dies 110, such as logic and memory.

In order to communicate data signals using proximity communication, transmit and receive proximity connectors 112 on adjacent semiconductor dies 110 may have, at worst, only limited misalignment, i.e., substantially accurate alignment. For densely packed proximity connectors, i.e., proximity connectors 112 having a small spacing or pitch 114 (FIG. 1) between adjacent pads, the alignment between two or more proximity connectors 112 on adjacent semiconductor dies 110 may be within a few microns in the first direction (X) 116 (FIG. 1) and/or a few microns in the second direction (Y) 118 (FIG. 1) in a first plane including at least some of the proximity connectors 112, and/or within a few microns in a third direction (Z) approximately perpendicular to the first plane. The system 200 illustrates a misalignment 214 in the third direction (Z).

In some embodiments, the proximity connectors 112 may be aligned in six degrees of freedom, including the first direction (X) 116 (FIG. 1), the second direction (Y) 118 (FIG. 1), the third direction (Z), an angle in the first plane defined by the first direction (X) 116 (FIG. 1) and the second direction (Y) 118 (FIG. 1) (illustrated below with reference to FIG. 3), an angle in a second plane defined by the first direction (X) 116 (FIG. 1) and the third direction (Z), and an angle in a third plane defined by the second direction (Y) 118 (FIG. 1) and the third direction (Z). Note that if a surface, such as the surface 208-1, of either of the adjacent semiconductor dies 110 is non-planar (for example, due to quadrupole distortion), additional alignment problems may be introduced.

In some embodiments, allowed misalignment in the first direction (X) 116 (FIG. 1), the second direction (Y) 118 (FIG. 1) and/or the third direction (Z) is less than one half of the pitch 114 (FIG. 1) between adjacent proximity connectors 112. For example, allowed misalignment in the first direction (X) 116 (FIG. 1) and/or the second direction (Y) 118 (FIG. 1) may be less than 25 µm, and the misalignment 214 in the third direction (Z) may be less than 5 µm.

Solutions, such as self-alignment and/or self-adjustment of relative positions of the proximity connectors 112 on adjacent semiconductor dies 110 and/or in a component coupling two or more semiconductor dies 110, may reduce and/or eliminate the misalignment 214 in the third direction (Z). For example, structures that have flexibility compliance or are spring-like may be used. In other embodiments, a feedback control loop may be used to reduce and/or eliminate the misalignment 214 in the third direction (Z).

Reducing or eliminating the misalignment 214, in turn, may lead to at least partial overlap of one or more proximity connectors 112 on the adjacent semiconductor dies 110 and increase a magnitude of the capacitively coupled data signals. In addition, the solutions may reduce misalignment in the first plane, i.e., the plane including at least some of the proximity connectors 112, when used in conjunction with techniques such as electronic steering, in which data signals are routed to respective proximity connectors 112 in accordance with the alignment in the first plane. (Note that steering mechanisms, such as multiplexers 216, may be included in or proximate to the arrays of proximity connectors 112 in order to facilitate such electronic steering in one or more of the semiconductor dies 110). As a consequence, these solutions may facilitate proximity communication between the semiconductor dies 110, SCMs and/or MCMs. The solutions may also reduce and/or eliminate a need for narrow tolerances, precise manufacturing, and/or precise assembly of the semiconductor dies 110, the SCM and/or the MCM.

In the embodiments described above and below, the proximity connectors 112 on the adjacent semiconductor dies 110 utilize capacitive coupling and/or a number of data signal channels for inter-chip communication. In other embodiments, additional connectors may be overlapped on adjacent semiconductor dies 110.

While the description below uses capacitively coupled proximity connectors as an illustration, one embodiment of the present invention uses magnetic proximity connectors, where data signals are communicated magnetically (inductive communication) between terminals on closely adjacent semiconductor dies 110. Another embodiment uses optical proximity connectors, where data signals are communicated optically between terminals (which may include optical emitters, detectors, and/or gratings) on adjacent semiconductor dies 110. Yet another embodiment couples connectors in adjacent semiconductor dies 110, for example, by using an array of solder balls (conductive communication).

While the device 100 (FIG. 1) and the system 200 are illustrated as having a number of components in a given configuration, in other embodiments the device 100 (FIG. 1) and/or the system 200 may include fewer components or additional components, two or more components may be combined into a single component, and/or a position of one or more components may be changed.

Figure 3:
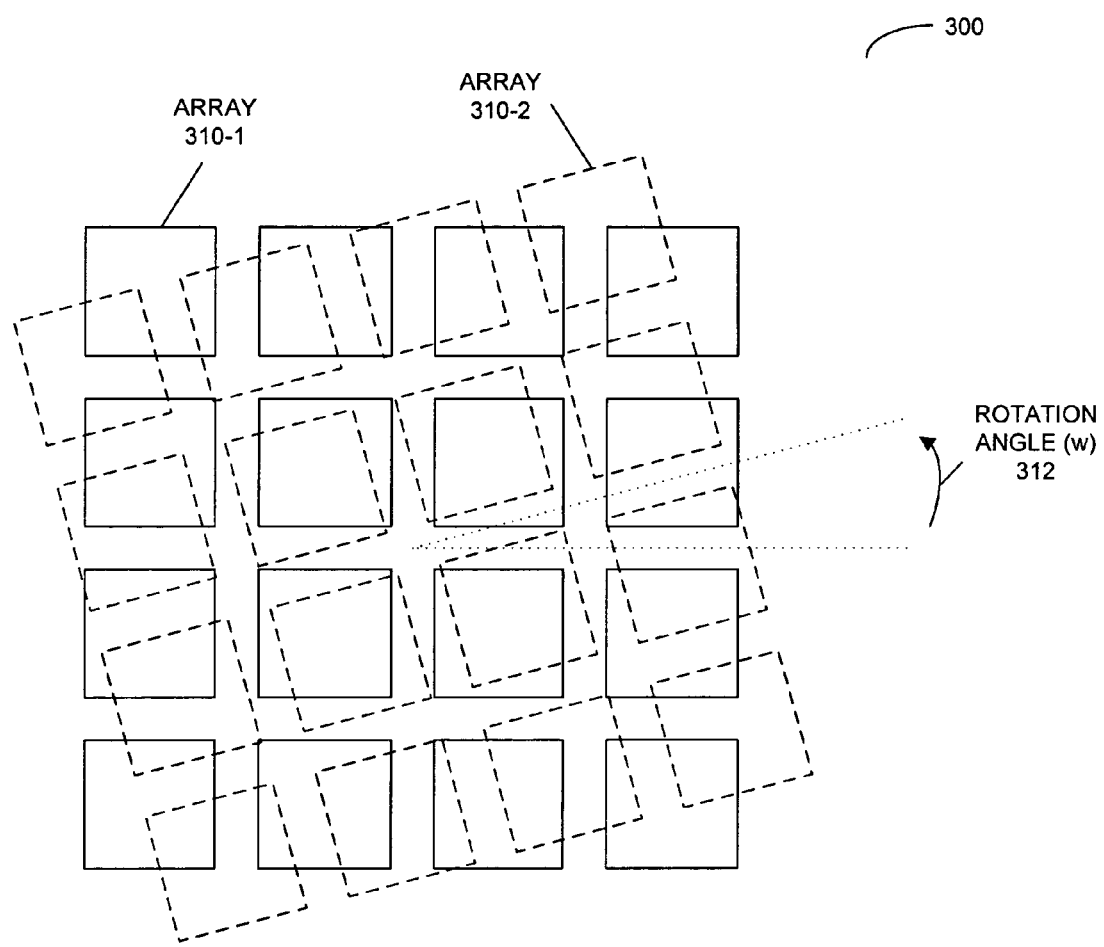
FIG. 3 is a block diagram illustrating in-plane rotational misalignment between arrays of proximity connectors in accordance with an embodiment of the present invention.

We now describe embodiments of devices configured to determine misalignment using spatial interference patterns. As noted previously, the ability to measure misalignment between the semiconductor dies 110 is often implicit to the ability to reduce such misalignment and/or to mitigating its effect on proximity communication (using techniques such as electronic steering). While the misalignment in all six degrees of freedom may be determined, the techniques described below are well suited to determining misalignment due to angular rotations in the first plane defined by the first direction (X) 116 (FIG. 1) and the second direction (Y) 118 (FIG. 1). This is illustrated in FIG. 3, which provides a block diagram illustrating misalignment between arrays of proximity connectors 310 due to an in-plane rotation angle (w) 312 in accordance with an embodiment 300 of the present invention.

Figure 4:
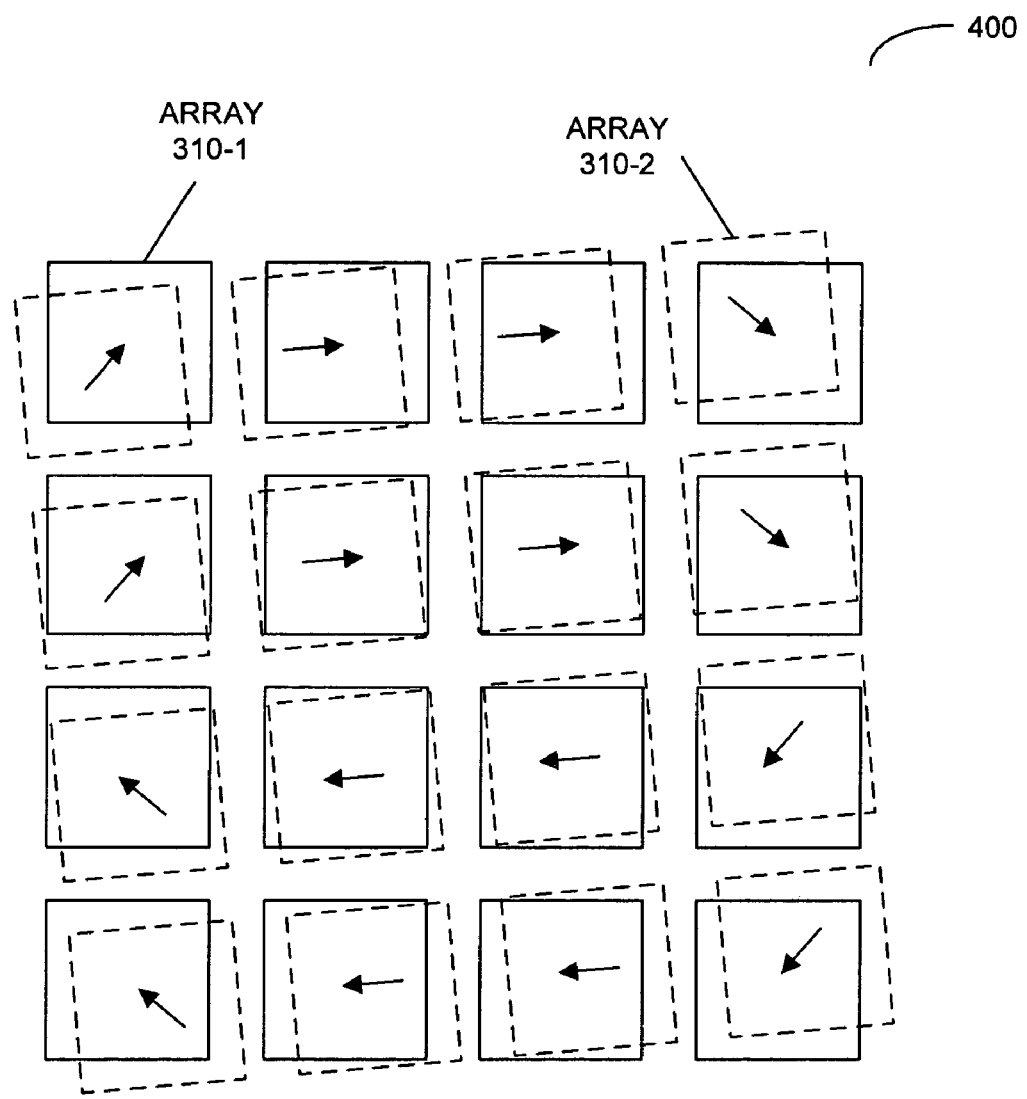
FIG. 4 is a block diagram illustrating how rotation between arrays of proximity connectors can be measured by determining nearest neighbors in accordance with an embodiment of the present invention.

FIG. 4 provides a block diagram illustrating measurement of rotation between the arrays of proximity connectors 310 by determining nearest neighbors in accordance with an embodiment 400 of the present invention. In particular, the coupling capacitance between a given receive proximity connector and each of several 'neighboring' transmit proximity connectors (or vice versa) is measured. From the relative magnitude of these capacitances, the nearest neighbor in the array of proximity connectors in one of the semiconductor dies to the given proximity connector on the other semiconductor die may be determined. By repeating this procedure for all of the proximity connectors in one of the arrays, the pattern of nearest neighbors illustrated by the arrows in the embodiment 400 may be determined. In turn, this nearest neighbor pattern may be used to determine the rotation angle (w) 312 (FIG. 3).

Unfortunately, measuring small differences in capacitance for each pad is difficult and time consuming, and is often inaccurate (especially for small rotation angles). However, when two periodic patterns overlap in space, aliasing may occur if the spatial frequencies of the two patterns differ along particular directions, either due to differences in the patterns themselves or due to translations or rotations between the patterns. Note that this phenomenon is also referred to as the Moiré effect.

Figure 5:
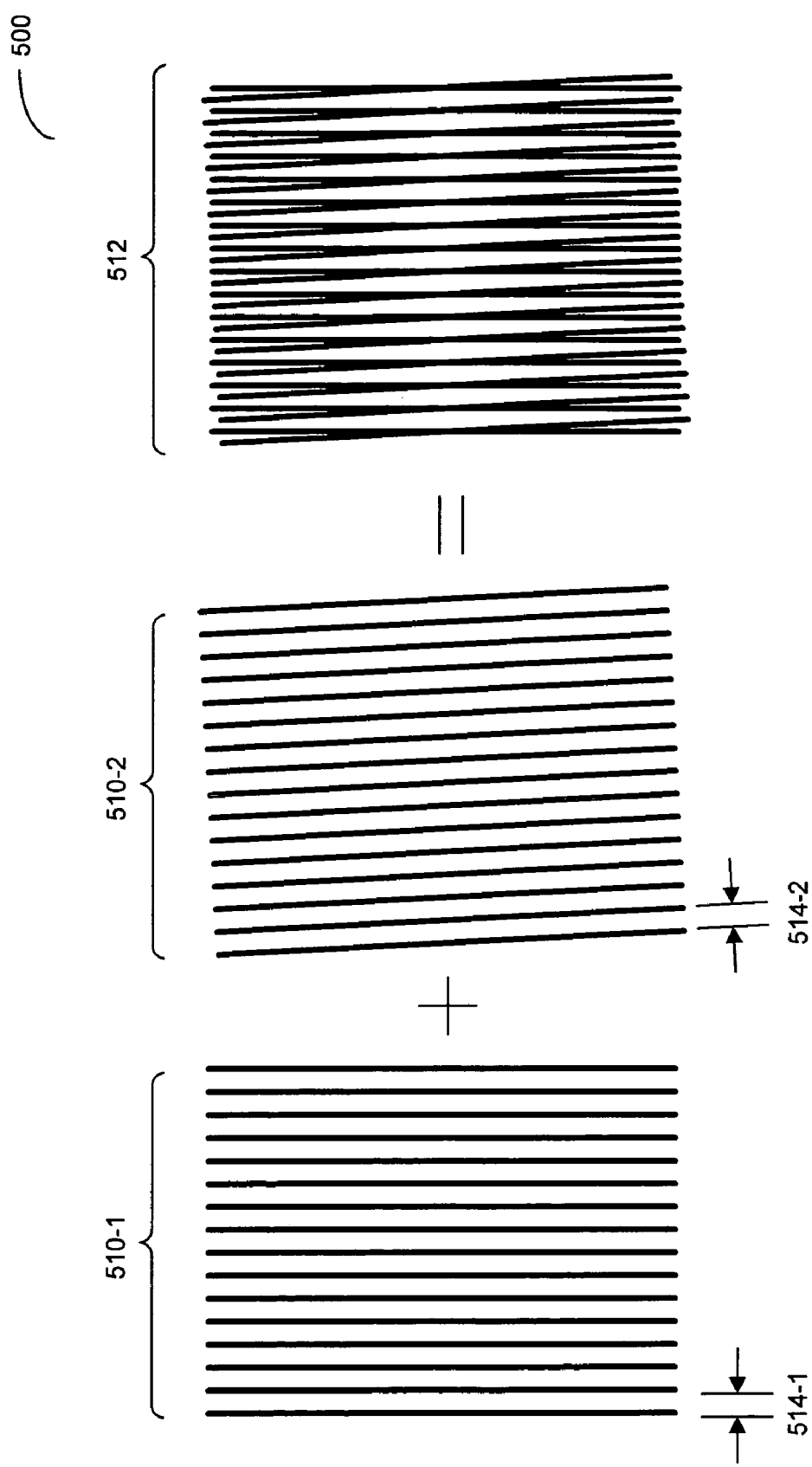
FIG. 5 is a block diagram illustrating an interference pattern between two sets of parallel lines in accordance with an embodiment of the present invention.

FIG. 5 provides a block diagram illustrating an interference pattern 512 between two sets of parallel lines 510, which each having a corresponding pitch 514, in accordance with an embodiment 500 of the present invention. (As described below in FIG. 12, in some embodiments the parallel lines 510 correspond to lines of proximity connectors in two adjacent semiconductor dies.) Since the two sets of parallel lines 510 are rotated with respect to one another, the two sets of parallel lines 510 have slightly different spatial frequencies along any given direction. As a consequence, when the two sets of parallel lines 510 are overlapped spatial aliasing occurs, thereby generating the interference pattern 512 with corresponding light and dark regions. Note that in the discussion below the light and dark regions are referred to as peaks and troughs, respectively.

Figure 6C:
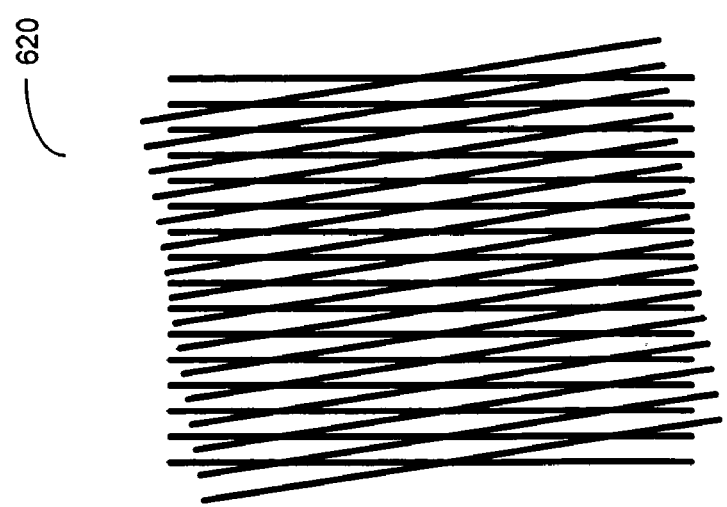
FIG. 6C is a block diagram illustrating an interference pattern between two sets of parallel lines in accordance with an embodiment of the present invention.
Figure 6B:
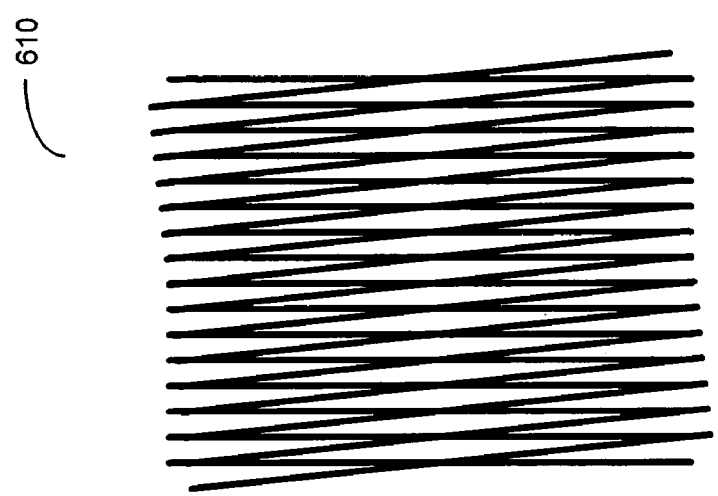
FIG. 6B is a block diagram illustrating an interference pattern between two sets of parallel lines in accordance with an embodiment of the present invention.
Figure 6A:
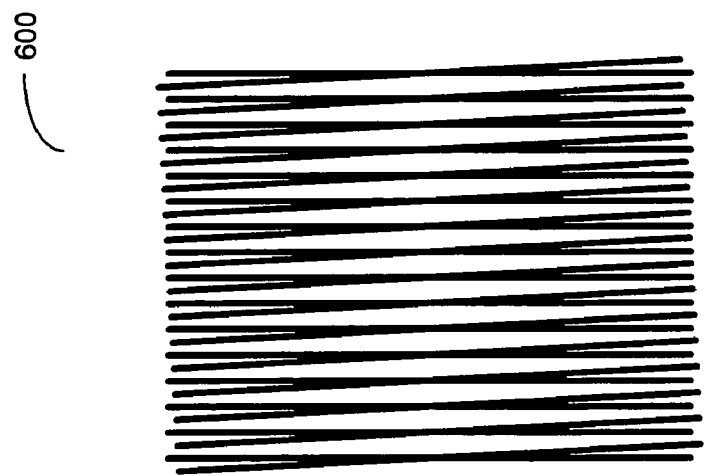
FIG. 6A is a block diagram illustrating an interference pattern between two sets of parallel lines in accordance with an embodiment of the present invention.

FIGS. 6A-6C, which provide block diagrams illustrating interference patterns between two sets of parallel lines in accordance with embodiments 600, 610 and 620 of the present invention, further illustrate the variation in the spatial interference pattern (i.e., the spatial distance between adjacent peaks and troughs) for three different rotation angles. Therefore, note that the Moiré effect essentially converts the amount of rotational misalignment into a spatial period ($\lambda$). As described below, depending on the choice of the pitch 514 (FIG. 5), this spatial period ($\lambda$) may be accurately measured over a desired range of the rotation angle (w) 312 (FIG. 3), such as for small angles.

Figure 7A:
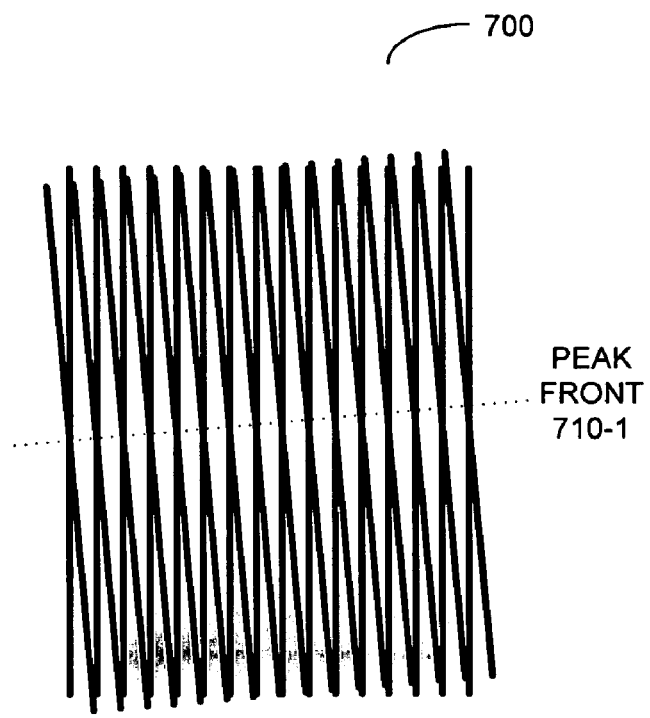
FIG. 7A is a block diagram illustrating a peak front in an interference pattern between two sets of parallel lines in accordance with an embodiment of the present invention.
Figure 7B:
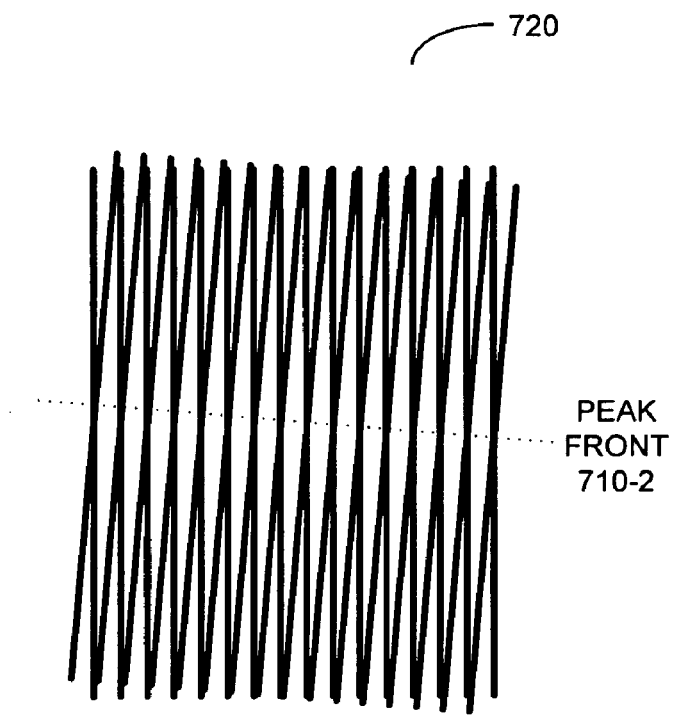
FIG. 7B is a block diagram illustrating a peak front in an interference pattern between two sets of parallel lines in accordance with an embodiment of the present invention.

Furthermore, also note that while the magnitude of the rotation angle (w) 312 (FIG. 3) may be determined in the proposed technique from measurements along one line in an interference pattern, the sign of the rotation angle (w) 312 (FIG. 3) may be determined from measurements along two or more lines. As illustrated in FIGS. 7A and 7B, which provide block diagrams illustrating interference patterns between two sets of parallel lines in accordance with embodiments 700 and 720 of the present invention, clockwise and counterclockwise rotation of the same magnitude result in the same spatial period ($\lambda$). However, peak fronts 710 corresponding to the peaks and troughs are located at different positions. Therefore, the sign or direction of the rotation angle (w) 312 (FIG. 3) may be determined by measuring the locations of the peaks and troughs at different positions in the interference pattern, for example, by performing measurements along two or more lines.

Figure 8:
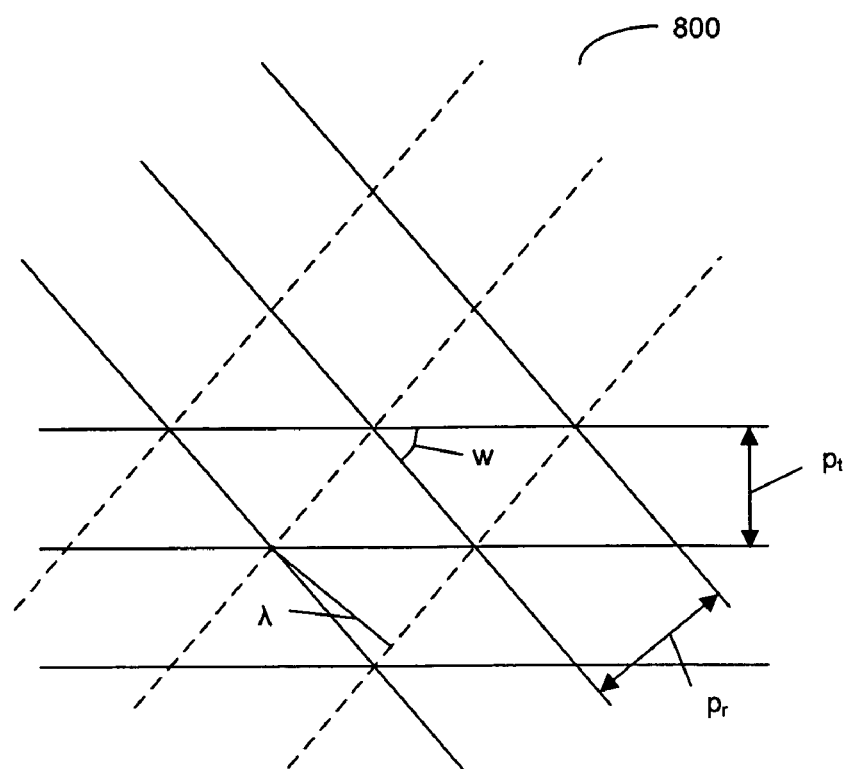
FIG. 8 is a block diagram illustrating a geometric interpretation of an interference pattern in accordance with an embodiment of the present invention.

We now describe the relationship between the spatial period ($\lambda$), the pitches 514 (FIG. 5) of the parallel sets of lines 510 (FIG. 5), and the rotation angle (w) 312 (FIG. 3). FIG. 8 provides a block diagram illustrating a geometric interpretation of an interference pattern in accordance with an embodiment 800 of the present invention. Let one set of parallel lines (such as those corresponding to transmit proximity connectors in one semiconductor die) have a pitch $p_t$, and the other set of parallel lines (such as those corresponding to receive proximity connectors in another semiconductor die) have a pitch $p_r$. Spatial period ($\lambda$) is a function of the pitch $p_t$, the pitch $p_r$, and the rotation angle (w). Note that the dotted lines in embodiment 800 connect interference peaks and troughs where the two parallel sets of lines intersect, and therefore correspond to peak fronts. Also note that the spatial period ($\lambda$) is the perpendicular distance between adjacent peak fronts.

Figure 9A:
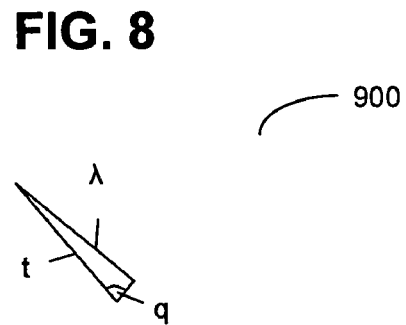
FIG. 9A is a block diagram illustrating a geometry extracted from an interference pattern in accordance with an embodiment of the present invention.
Figure 9B:
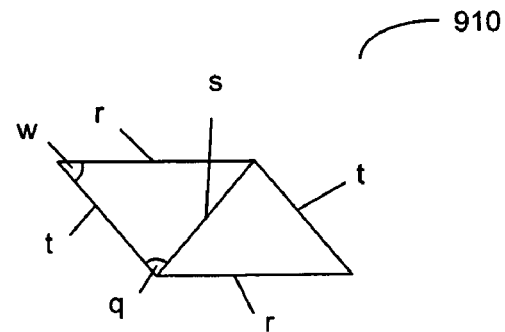
FIG. 9B is a block diagram illustrating a geometry extracted from an interference pattern in accordance with an embodiment of the present invention.

FIGS. 9A and 9B provide block diagrams illustrating geometries extracted from the interference pattern in the embodiment 800 (FIG. 8) in accordance with embodiments 900 and 910 of the present invention. We first define two quantities, $$r = \frac{p_r}{\sin(w)} \quad (1)$$

and $$t = \frac{p_t}{\sin(w)}. \quad (2)$$

From embodiment 910, $$s^2 = r^2 + t^2 - 2rt\cos(w) \quad (3)$$

and $$\sin(q) = \frac{r}{s}\sin(w). \quad (2)$$

And from embodiment 900, $$\lambda = t\sin(q). \quad (5)$$

From Eqns. 3-5, one can show $$\lambda^2 = \frac{r^2 t^2 (1 - \cos^2(w))}{r^2 + t^2 - 2rt\cos(w)}.$$

Furthermore, using Eqns. 1 and 2 one can show $$\lambda^2 = \frac{p_r^2 p_t^2}{p_r^2 + p_t^2 - 2p_r p_t \cos(w)} \quad (6)$$

or $$\lambda = \frac{p_r p_t}{\sqrt{p_r^2 + p_t^2 - 2p_r p_t \cos(w)}}.$$

Figure 10:
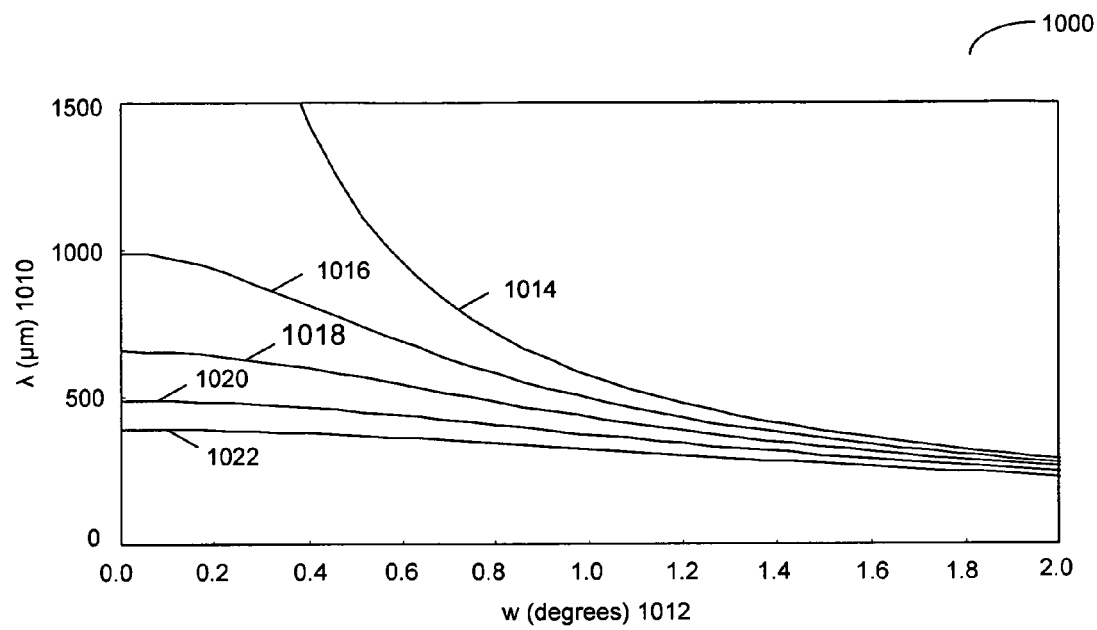
FIG. 10 is a diagram illustrating spatial period ($\lambda$) as a function of rotation angle (w) for several values of pitch difference ($\Delta p$) in accordance with an embodiment of the present invention.

This functional relationship is illustrated in FIG. 10, which provides a diagram illustrating spatial period (λ) 1010 as a function of rotation angle (w) 1012 for several values of pitch difference Δp (defined as the absolute value of the difference between $p_r$ and $p_t$), including 0 μm (1014), 0.1 μm (1016), 0.15 μm (1018), 0.2 μm (1020), and 0.25 μm (1022), with $p_r$=10 μm in accordance with an embodiment 1000 of the present invention. Note that the spatial period (λ) 1010 is very large for small values of the rotation angle (w) 1012. In particular, when $p_t=p_r=p$ the spatial period (λ) is $$\lambda = \frac{p}{\sqrt{2}} \frac{1}{\sqrt{1 - \cos(w)}}.$$

Applying l'Hôpital's rule to Eqn. 6 for small values of w, we find, $$\lim_{\lambda \to \infty} \lambda^2 = \frac{p_r^2 p_t^2}{(p_r - p_t)^2 - w^2 p_r p_t} \quad (10)$$

and including $p_r = p_t = p$, we have $$\lambda \approx \frac{p}{w}.$$

This property makes it possible to detect very small rotation angles because the Moiré phenomenon effectively amplifies the small values of the rotation angle (w) 1012 into very large values of the spatial period (λ) 1010.

Similarly, the inverse of the sensitivity (dw/dλ) may be determined. From Eqn. 10, w may be expressed as $$w = \sqrt{\frac{p_r p_t}{\lambda^2} - \frac{(p_r - p_t)^2}{p_r p_t}} = \sqrt{\frac{p_r p_t}{\lambda^2} - \frac{\Delta p^2}{p_r p_t}}$$

and the inverse of the sensitivity as $$\frac{dw}{d\lambda} = -\frac{p_r p_t}{\lambda^3 \sqrt{\frac{p_r p_t}{\lambda^2} - \frac{\Delta p^2}{p_r p_t}}}. \quad (11)$$

Figure 11:
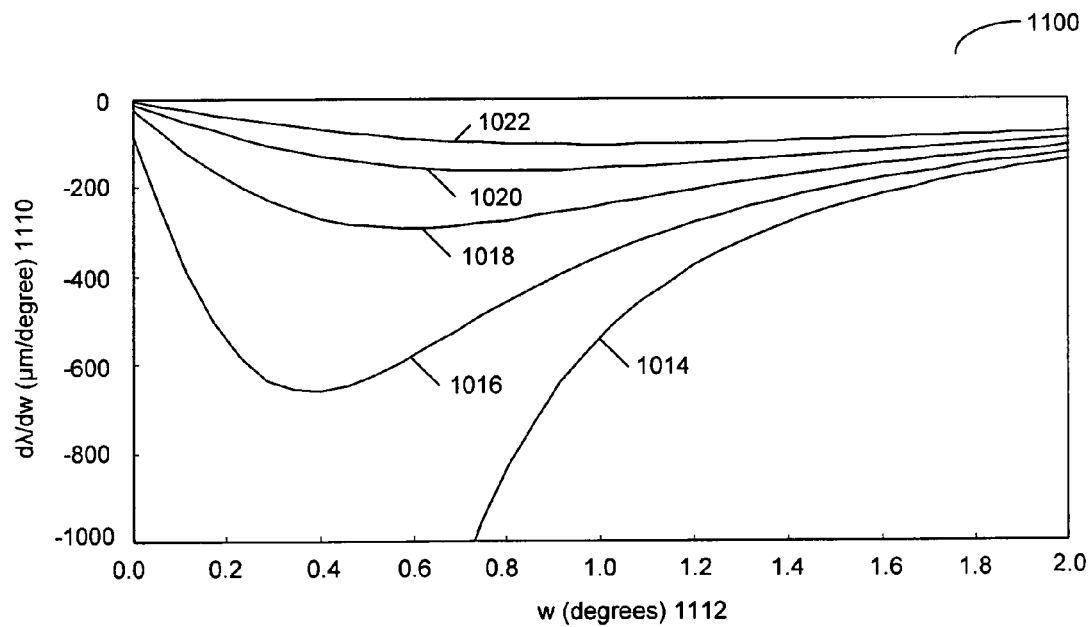
FIG. 11 is a diagram illustrating inverse sensitivity as a function of rotation angle (w) for several values of pitch difference ($\Delta p$) in accordance with an embodiment of the present invention.

FIG. 11 is a diagram illustrating inverse sensitivity 1110 as a function of rotation angle (w) 1112 for several values of pitch difference Δp, with $p_r$=10 μm in accordance with an embodiment 1100 of the present invention. Note that for small values of Δp, i.e., Δp<<$(p_r p_t)$/λ, the error in w in terms of the fractional uncertainty in λ is $$|dw| = \frac{\sqrt{p_r p_t}}{\lambda} \left(\frac{|d\lambda|}{\lambda}\right).$$

For example, for $p_r$=10 μm, $p_t$=9.9 μm, Δp=0.1 μm, λ=494 μm, and w=1°, an uncertainty in λ of 0.05 (5%) results in an error in w of 0.058°.

Figure 12:
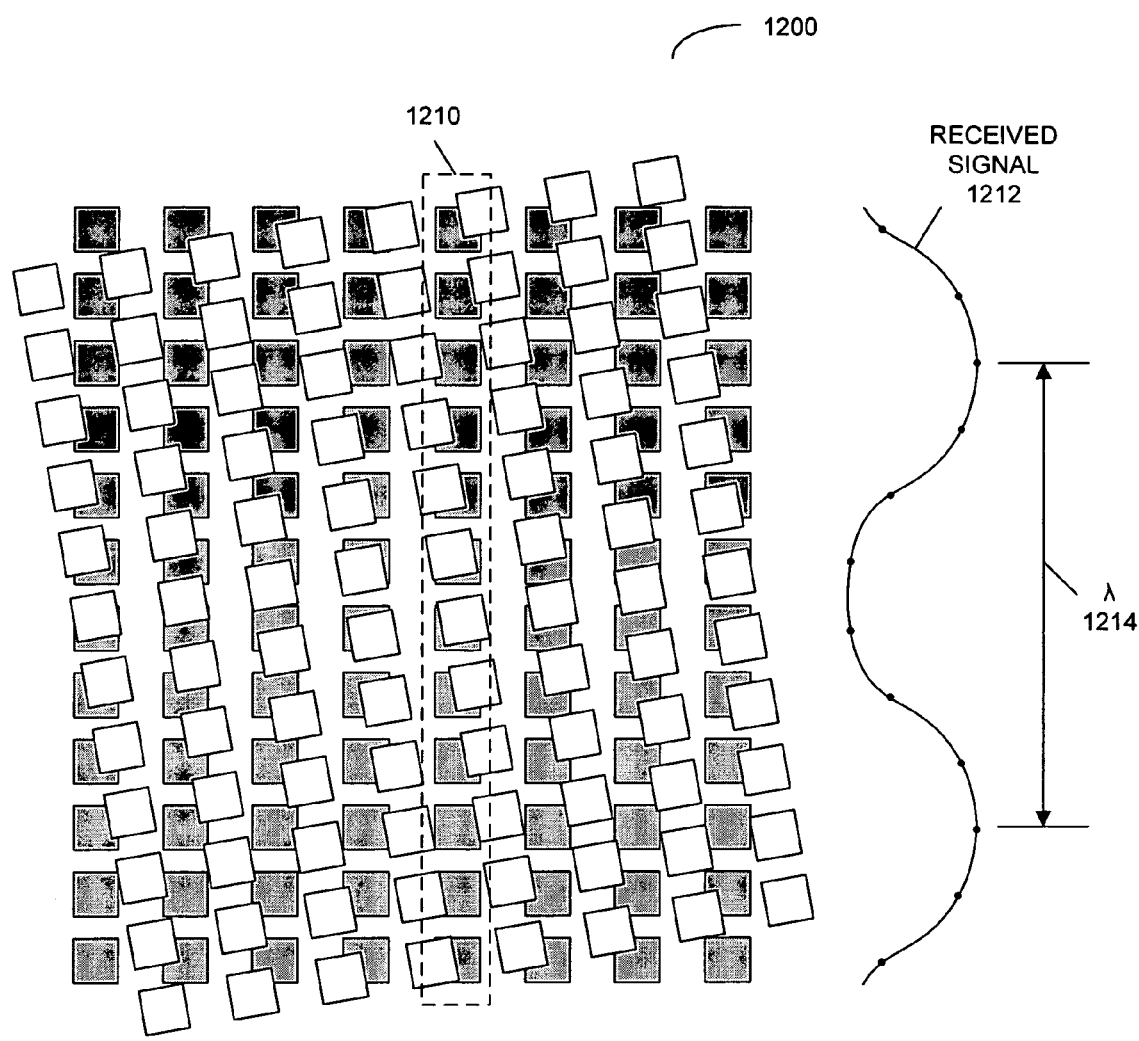
FIG. 12 is a block diagram illustrating arrays of proximity connectors in accordance with an embodiment of the present invention.

Misalignment between semiconductor dies, such as the semiconductor dies 110 (FIG. 2), may be determined using the interference-pattern technique. In an exemplary embodiment, a subset of proximity connectors proximate to the surface of each of the semiconductor dies may be used. For example, lines of proximity connectors (having a pitch $p_t$) may transmit signals in one semiconductor die and lines of proximity connectors (having a pitch $p_r$) may receive signals in the other semiconductor die. This is illustrated in FIG. 12, which provides a block diagram illustrating arrays of proximity connectors in accordance with an embodiment 1200 of the present invention, where the white-colored squares indicate lines of proximity connectors in one semiconductor die and the gray-colored squares indicate lines proximity connectors in the other semiconductor die.

In embodiment 1200, multiple proximity lines of proximity connectors may transmit signals and, at a given time, a line of proximity connectors 1210 may receive signals along different points on the line (which correspond to the individual proximity connectors). As discussed previously, in order to determine the sign of the rotation angle (w), in some embodiments one or more additional lines of proximity connectors may receive signals concurrently or consecutively. In some embodiments, alternating lines of proximity connectors in arrays of proximity connectors are used to transmit and/or to receive signals. Furthermore, the signals may be received by measuring voltages corresponding to signals transmitted on lines of proximity connectors in the other semiconductor die, or by determining the coupling capacitances between the proximity connectors in the line of proximity connectors 1210 and corresponding proximity connectors in the other semiconductor die.

Due to the Moiré effect, some of the proximity connectors in the line of proximity connectors 1210 will receive stronger signals since they have a larger overlap with the proximity connectors on the semiconductor die that is transmitting. Therefore, the collection of signals along the line, i.e., received signal 1212, includes the effect of the interference pattern and has peaks and troughs. As a consequence, spatial period ($\lambda$) 1214, and thus the rotational misalignment, may be determined from received signal 1212.

In some embodiments, the pitches $p_t$ and $p_r$ of the lines of proximity connectors are the same or are different. These pitches may be chosen based on the inverse sensitivity requirements described above in Eqn. 11 and/or in order to span the full range of spatial periods ($\lambda$), i.e., the range of rotation angles that may be encountered. For example, in some embodiments a larger measurement structure (the size of the array of proximity connectors) is used, which allows smaller values of $\Delta p$, improved sensitivity, and larger values of the spatial period ($\lambda$) to be determined. In an exemplary embodiment $\Delta p=0$, $p_t=p_r=10$ µm, and w is approximately between 0 and 2° (misalignment in this range may be achieved, at least in part, using mechanical packaging such as SCMs and MCMs).

The determined misalignment may be used to determine the routing of signals using an electronic steering mechanism, such as one or more of the multiplexers 216 (FIG. 2). As a consequence, the misalignment may be determined once, after a time interval (which may be variable or fixed), and/or continuously. In some embodiments, the misalignment is determined intermittently. For example, if a metric of communication performance (such as a signal magnitude, a mean square error, and/or a bit-error rate) degrades, one of the semiconductor dies may enter a calibration mode of operation based on instructions executed by control logic. In the calibration mode of operation, the misalignment is determined.

While the embodiment 1200 has been described with a given configuration, in other embodiments there may be fewer components or additional components, two or more components may be combined into a single component, and/or a position of one or more components may be changed.

Figure 13A:
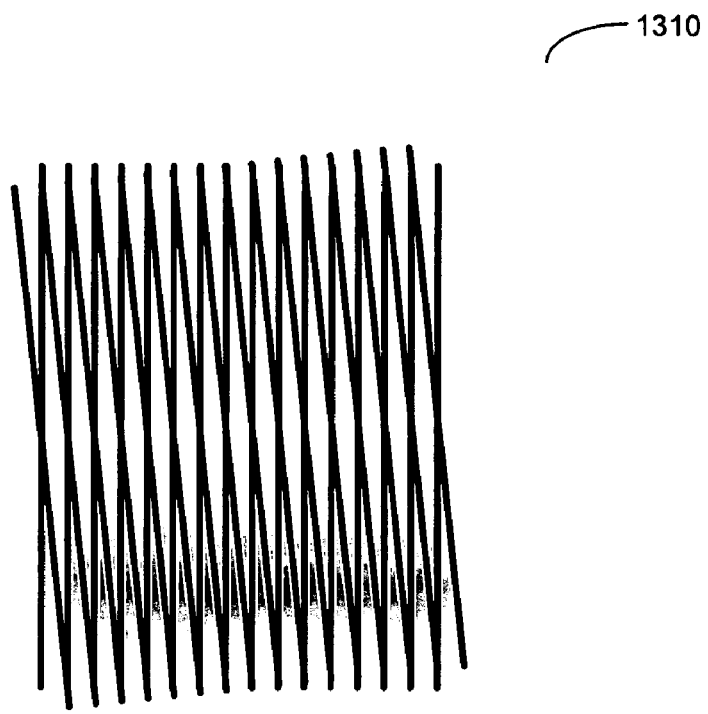
FIG. 13A is a block diagram illustrating an interference pattern between two sets of parallel lines in accordance with an embodiment of the present invention.
Figure 13B:
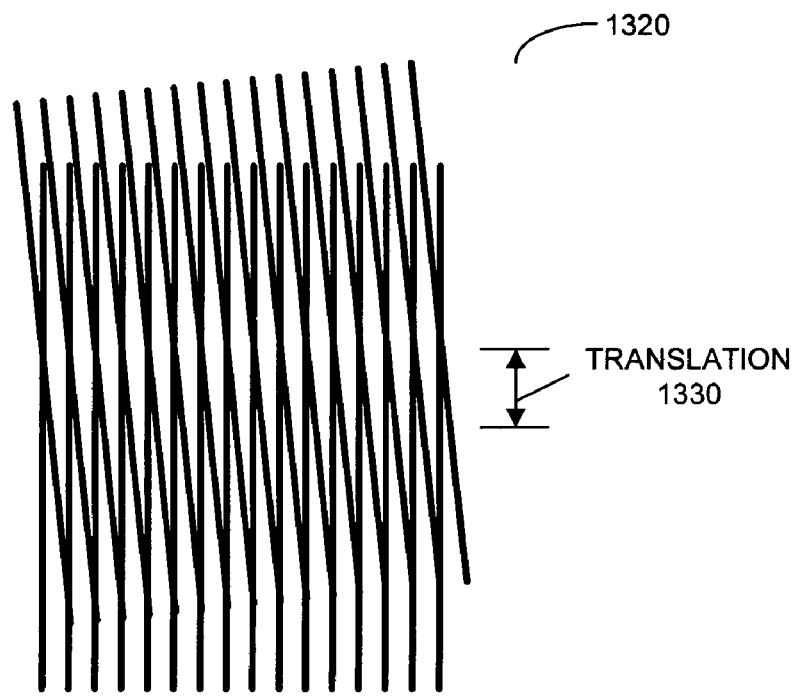
FIG. 13B is a block diagram illustrating an interference pattern between two sets of parallel lines in accordance with an embodiment of the present invention.

In addition, while the preceding discussion has used parallel lines of proximity connectors to determine angular misalignment, the interference-pattern technique may be used to determine and/or correct for other types of misalignment. However, such measurements may use different arrangements of proximity connectors. For example, parallel lines of proximity connectors are insensitive to translational misalignment for a given angular rotation. This is illustrated in FIGS. 13A and 13B, which provide block diagrams illustrating interference patterns between two sets of parallel lines in accordance with embodiments 1310 and 1320 of the present invention, where embodiment 1320 includes translation 1330 between the sets of lines. Also note that the interference patterns are independent of the center of rotation.

Figure 14A:
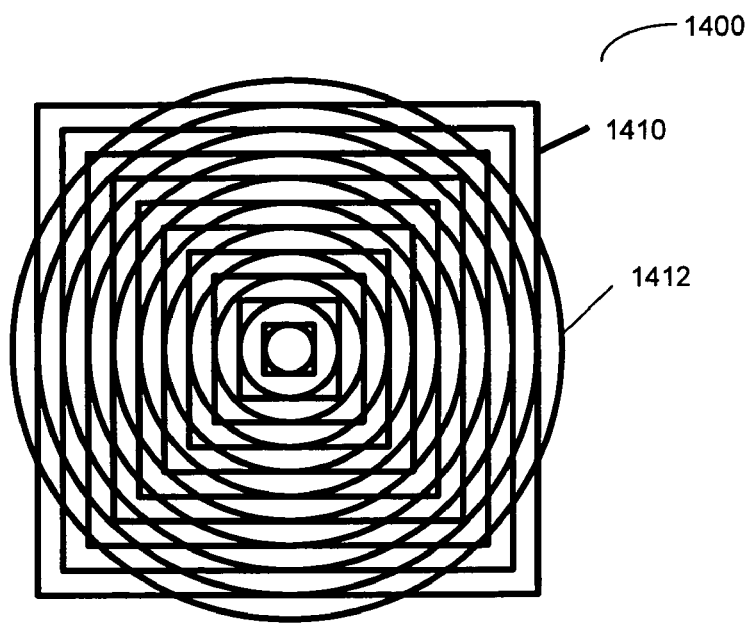
FIG. 14A is a block diagram illustrating an interference pattern in accordance with an embodiment of the present invention.
Figure 14B:
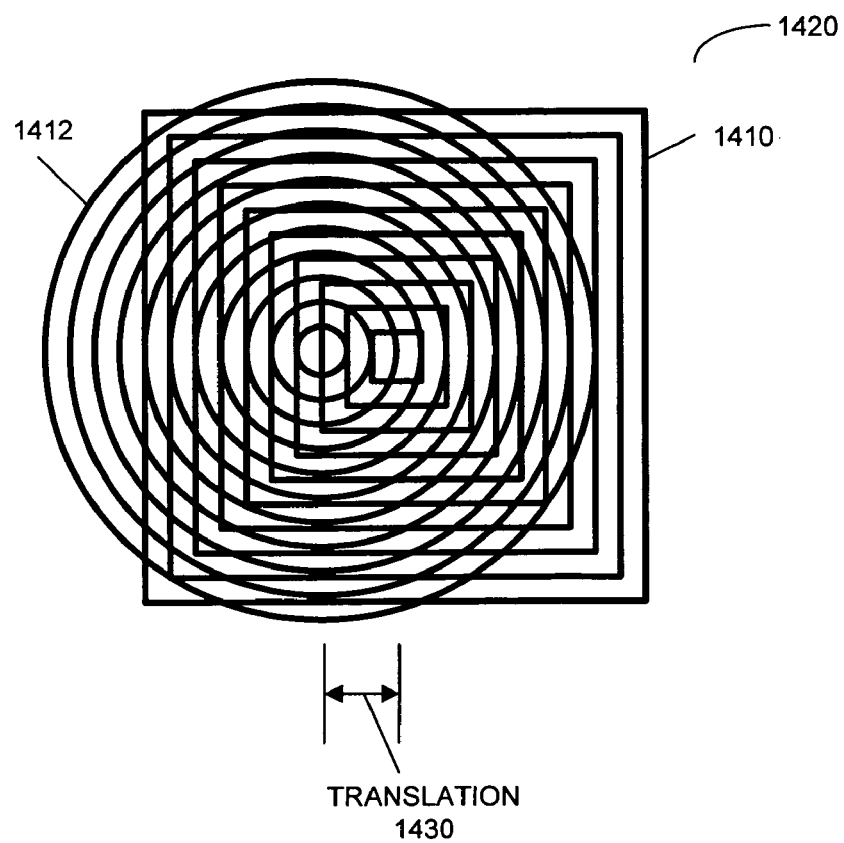
FIG. 14B is a block diagram illustrating an interference pattern in accordance with an embodiment of the present invention.

FIGS. 14A and 14B provide block diagrams illustrating patterns 1410 and 1412 that result in an interference pattern that may be used to determine translational misalignment 1430 in accordance with embodiments 1400 and 1420 of the present invention. In addition to these and other patterns that may be used to determine one or more types of misalignment in the six degrees of freedom between the two semiconductor dies, in other embodiments the interference-pattern technique is used in conjunction with one or more other techniques to determine one or more types of misalignment.

Figure 15:
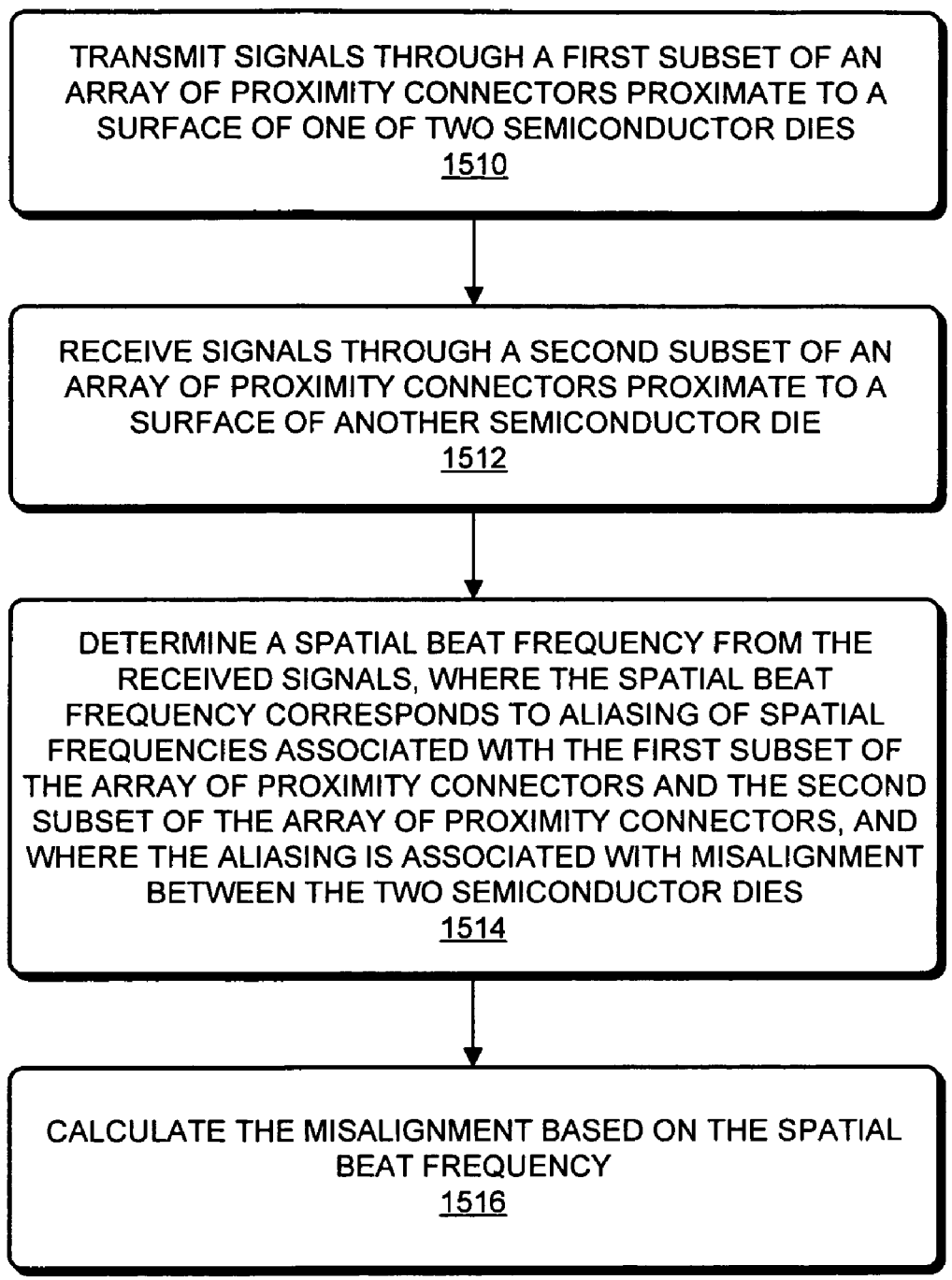
FIG. 15 is a flow chart illustrating a process for determining misalignment in accordance with an embodiment of the present invention.

We now discuss methods for determining misalignment between semiconductor dies. FIG. 15 is a flow chart illustrating a process for determining misalignment in accordance with an embodiment 1500 of the present invention. During this process, signals are transmitted through a first subset of an array of proximity connectors proximate to a surface of one of two semiconductor dies (1510) and received through a second subset of an array of proximity connectors proximate to a surface of another semiconductor die (1512). Using the received signals, a spatial beat frequency is determined (1514). This spatial beat frequency corresponds to aliasing of spatial frequencies associated with the first subset of the array of proximity connectors and the second subset of the array of proximity connectors. Note that the aliasing is associated with misalignment between the two semiconductor dies. Furthermore, the misalignment is calculated based on the spatial beat frequency (1516). In some embodiments, there may be additional or fewer operations, the order of the operations may be changed, and two or more operations may be combined into a single operation.

Figure 16:
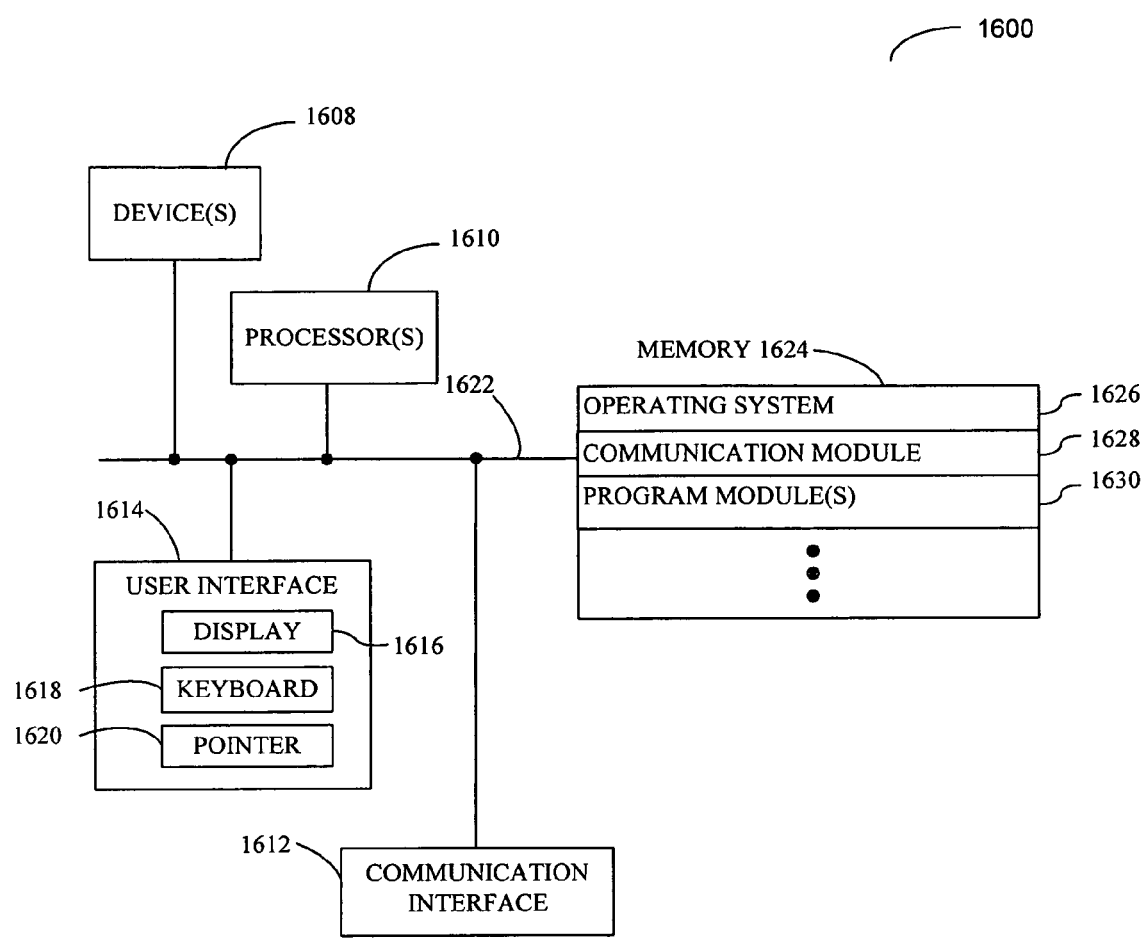
FIG. 16 is a block diagram illustrating a computer system in accordance with an embodiment of the present invention.

The present invention may include systems that contain one or more devices that include components (such as one or more semiconductor dies) that communicate signals using capacitively coupled proximity connectors. For example, FIG. 16 presents a block diagram illustrating a computer system 1600 in accordance with an embodiment of the present invention, which includes one or more processors 1610, a communication interface 1612, a user interface 1614, and one or more signal lines 1622 coupling these components together. Note that the one or more processing units 1610 may support parallel processing and/or multi-threaded operation, the communication interface 1612 may have a persistent communication connection, and the one or more signal lines 1622 may constitute a communication bus. Moreover, the user interface 1614 may include a display 1616, a keyboard 1618, and/or a pointer, such as a mouse 1620.

The computer system 1600 may include memory 1624, which may include high speed random access memory and/or non-volatile memory. More specifically, memory 1624 may include ROM, RAM, EPROM, EEPROM, FLASH, one or more smart cards, one or more magnetic disc storage devices, and/or one or more optical storage devices. Memory 1624 may store an operating system 1626, such as SOLARIS, LINUX, UNIX, OS X, or WINDOWS, that includes procedures (or a set of instructions) for handling various basic system services for performing hardware dependent tasks. The memory 1624 may also store procedures (or a set of instructions) in a communication module 1628. The communication procedures may be used for communicating with one or more computers and/or servers, including computers and/or servers that are remotely located with respect to the computer system 1600.

Memory 1624 may also include the one or more program modules (of sets of instructions) 1630. Instructions in the program modules 1630 in the memory 1624 may be implemented in a high-level procedural language, an object-oriented programming language, and/or in an assembly or machine language. The programming language may be compiled or interpreted, i.e, configurable or configured to be executed by the one or more processing units 1610.

The computer system 1600 may include one or more devices 1608 that include semiconductor dies that communicate using proximity communication as described in the previous embodiments.

The computer system 1600 may include fewer components or additional components, two or more components may be combined into a single component, and/or a position of one or more components may be changed. In some embodiments, the functionality of the computer system 1600 may be implemented more in hardware and less in software, or less in hardware and more in software, as is known in the art.

Although the computer system 1600 is illustrated as having a number of discrete items, FIG. 16 is intended to be a functional description of the various features that may be present in the computer system 1600 rather than as a structural schematic of the embodiments described herein. In practice, and as recognized by those of ordinary skill in the art, the functions of the computer system 1600 may be distributed over a large number of servers or computers, with various groups of the servers or computers performing particular subsets of the functions. In some embodiments, some or all of the functionality of the computer system 1600 may be implemented in one or more application specific integrated circuits (ASICs) and/or one or more digital signal processors (DSPs).

While the preceding embodiments have discussed the application of interference patterns in determining misalignment between semiconductor dies, in other embodiments the invention may be applied to a wide variety of problems, such as determining misalignment in signal processing, pattern recognition, manufacturing (such as printed circuit board assembly), and feedback control, as well as the measurement of rotation angles (for example, using an image sensor, such as charge coupled device, and a striped target).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a misalignment between a first semiconductor die and a second semiconductor die, comprising:

transmitting signals through a first subset of an array of proximity connectors that are proximate to a surface of the first semiconductor die;

receiving signals through a second subset of an array of proximity connectors that are proximate to a surface of the second semiconductor die;

determining a spatial beat frequency from the received signals, wherein the spatial beat frequency corresponds to aliasing of spatial frequencies associated with the first subset of the array of proximity connectors and the second subset of the array of proximity connectors, and wherein the aliasing is associated with the misalignment that corresponds to an angular rotation of the first semiconductor die with respect to the second semiconductor die in a plane substantially parallel to the surface of one of the two semiconductor dies; and calculating the misalignment using the spatial beat frequency.

2. The method of claim 1, wherein the two semiconductor dies are configured to communicate via capacitive coupling.

3. The method of claim 1, wherein the two semiconductor dies are configured to communicate optically, inductively, or conductively.

4. The method of claim 1, wherein receiving the signals involves measuring a set of capacitance values.

5. The method of claim 1, wherein receiving the signals involves measuring a set of voltages corresponding to the signals on the second subset of proximity connectors.

6. The method of claim 1, wherein the misalignment further corresponds to a translational misalignment of the first semiconductor die relative to the second semiconductor die.

7. The method of claim 6, wherein the angular rotation is approximately between 0 and 2°.

8. The method of claim 1, wherein the first subset of the array of proximity connectors are arranged substantially along a set of parallel lines.

9. The method of claim 1, wherein the second subset of the array of proximity connectors are arranged substantially along a set of parallel lines.

10. The method of claim 1, further comprising determining locations of extrema of the received signals and calculating a sign of the misalignment based on these locations.

11. The method of claim 1, wherein a pitch between adjacent proximity connectors in the first subset is different that a pitch between adjacent proximity connectors in the second subset.

12. The method of claim 1, further comprising steering electrical signals using a steering mechanism that is internal to a given array of proximity connectors that are proximate to the surface of one of the semiconductor dies based on the misalignment, thereby enabling communication between the two semiconductor dies via capacitive coupling.

13. The method of claim 1, wherein determining of the misalignment is performed continuously.

14. The method of claim 1, wherein determining of the misalignment is performed at times separated by an interval.

15. The method of claim 14, wherein the interval is substantially fixed.

16. A configuration to determine misalignment between a first semiconductor die and a second semiconductor die, comprising:

proximity connectors arranged in a first array that is proximate to a surface of the first semiconductor die; and proximity connectors arranged in a second array that is proximate to a surface of the second semiconductor die, wherein the first semiconductor die is configured to transmit signals using a first subset of the proximity connectors in the first array;

wherein the second semiconductor die is configured to receive signals via capacitive coupling using a second subset of the proximity connectors in the second array, and wherein the second semiconductor die is further configured to determine a spatial beat frequency from the received signals and to calculate the misalignment based on the spatial beat frequency; and wherein the spatial beat frequency corresponds to aliasing of spatial frequencies associated with the first subset of the proximity connectors in the first array and the second subset of the proximity connectors in the second array, and wherein the aliasing is associated with the misalignment that corresponds to an angular rotation of the first semiconductor die with respect to the second semiconductor die in a plane substantially parallel to the surface of one of the two semiconductor dies.

17. The configuration of claim 16, wherein the second semiconductor die is further configured to determine locations of extrema of the received signals and to calculate a sign of the misalignment based on these locations.

18. The configuration of claim 16, wherein the misalignment further corresponds to a translational misalignment of the first semiconductor die relative to the second semiconductor die.

19. The configuration of claim 16, wherein the first semiconductor die is further configured to steer electrical signals using a steering mechanism that is internal to the first array of proximity connectors based on the misalignment, thereby enabling communication between the first semiconductor die and the second semiconductor die via capacitive coupling.

20. A computer system, comprising:
a processor;
a memory; and
a device comprising a first semiconductor die and a second semiconductor die, wherein the device comprises:

proximity connectors arranged in a first array that are proximate to a surface of the first semiconductor die; and proximity connectors arranged in a second array that are proximate to a surface of the second semiconductor die, wherein the first semiconductor die is configured to transmit signals using a first subset of the proximity connectors in the first array;

wherein the second semiconductor die is configured to receive signals via capacitive coupling using a second subset of the proximity connectors in the second array, and wherein the second semiconductor die is further configured to determine a spatial beat frequency from the received signals and to calculate a misalignment between the first semiconductor die and the second semiconductor die based on the spatial beat frequency; and wherein the spatial beat frequency corresponds to aliasing of spatial frequencies associated with the first subset of the proximity connectors in the first array and the second subset of the proximity connectors in the second array, and wherein the aliasing is associated with the misalignment that corresponds to an angular rotation of the first semiconductor die with respect to the second semiconductor die in a plane substantially parallel to the surface of one of the two semiconductor dies.

* * * * *